United States Patent
Forrest et al.

(10) Patent No.: US 8,952,362 B2
(45) Date of Patent: Feb. 10, 2015

(54) HIGH EFFICIENCY AND BRIGHTNESS FLUORESCENT ORGANIC LIGHT EMITTING DIODE BY TRIPLET-TRIPLET FUSION

(75) Inventors: Stephen Forrest, Ann Arbor, MI (US); Yifan Zhang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/600,651

(22) Filed: Aug. 31, 2012

(65) Prior Publication Data

US 2014/0061594 A1 Mar. 6, 2014

(51) Int. Cl.
*H01L 51/54* (2006.01)

(52) U.S. Cl.
USPC ............... 257/40; 257/144; 257/E51.026

(58) Field of Classification Search
USPC .................................. 257/40, 144
See application file for complete search history.

(56) References Cited

U.S. PATENT DOCUMENTS

| | | | |
|---|---|---|---|
| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Thanh T Nguyen
(74) *Attorney, Agent, or Firm* — Duane Morris LLP (57) ABSTRACT

A first device is provided. The first device further comprises an organic light emitting device. The organic light emitting device further comprises an anode, a cathode, and an emissive layer disposed between the anode and the cathode. The emissive layer may include an organic host compound and at least one organic emitting compound capable of fluorescent emission at room temperature. Various configurations are described for providing a range of current densities in which T-T fusion dominates over S-T annihilation, leading to very high efficiency fluorescent OLEDs.

29 Claims, 7 Drawing Sheets

(56) References Cited

U.S. PATENT DOCUMENTS

| | | |
|---|---|---|
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0214553 A1* | 9/2006 | Nagara et al. ............... 313/483 |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0275266 A1* | 11/2007 | Jinde et al. ................... 428/690 |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Pakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3, (2007).

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiciiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater, 16(12):2480-2488 (2004).

Hung, L.S. et al., "Anode Modification in Organic Light-Emitting Diodes by Low-Frequency Plasma Polymerization of CHF3," Appl. Phys. Lett, 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

(56) References Cited

OTHER PUBLICATIONS

Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett, 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15)2280-2282 (2000).
Lo, Shih-Chun et al., "Blue Phosphorescence from Indium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto,Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. And VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

\* cited by examiner

HIGH EFFICIENCY AND BRIGHTNESS FLUORESCENT ORGANIC LIGHT EMITTING DIODE BY TRIPLET-TRIPLET FUSION

This invention was made with government support under DE-SC0001013 awarded by the Department of Energy. The government has certain rights in the invention.

The claimed invention was made by, on behalf of, and/or in connection with one or more of the following parties to a joint university corporation research agreement: The Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices including material combinations with improved properties.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photo detectors.

More details on OLEDs can be found in U.S. Pat. No. 7,279,704, which is incorporated herein by reference in its entirety.

Various ways to deposit the organic materials used to fabricate organic devices are known, such as vacuum thermal evaporation, solution processing, organic vapor phase deposition, and organic vapor jet printing.

SUMMARY OF THE INVENTION

The present subject matter relates to the non-radiative triplets in fluorescent organic light emitting diodes (OLEDs) can lead to increased efficiency through triplet-triplet (T-T) fusion, or to decreased efficiency due to singlet-triplet (S-T) annihilation. The inventors have studied the tradeoff between the two processes, and determined various configurations providing a range of current densities in which T-T fusion dominates over S-T annihilation, leading to very high efficiency fluorescent OLEDs.

According to first aspects of the invention, an organic light emitting device may be provided including an anode, a cathode, and an emissive layer disposed between the anode and the cathode. The emissive layer may include an organic host compound and at least one organic emitting compound capable of fluorescent emission at room temperature.

In embodiments, the overlap between the singlet emission spectrum of the organic emitting compound and the triplet absorption spectrum of the host compound may be less than 20 percent or preferably less than 10%.

In embodiments, the host compound may have a triplet energy and a singlet energy, such that twice the host compound triplet energy plus 0.3 eV may greater than the host compound singlet energy. Preferably, twice the host material compound energy minus 0.5 eV may be less than the host compound singlet energy.

In embodiments, the exciton diffusion length may be at least greater than half the thickness of the emissive layer.

In embodiments, the emissive layer may have a thickness of, for example, about 100 nm to about 10 nm, about 75 nm to about 25 nm, or about 50 nm to about 25 nm.

In embodiments, the electroluminescent internal quantum efficiency of the emitter may be, for example, greater than 50%, or greater than 60%.

In embodiments, the emissive layer may include tetraphenyldibenzoperiflanthene doped in rubrene. In embodiments, the tetraphenyldibenzoperiflanthene may be doped at about 1 vol %.

In embodiments, the emissive layer may include a dopant selected from the group consisting of: anthracene, tetracene, rubrene, and perylene and their derivatives.

In embodiments, the emissive layer may include a host selected from the group consisting of: anthracene, tetracene, rubrene, and perylene and their derivatives.

In embodiments, the device may be a consumer product or incorporated in a consumer product, such as, for example, a flat panel display, a computer monitor, a television, a light for interior or exterior illumination and/or signaling, a heads up display, a printer, a telephone, a personal digital assistant (PDA), a laptop or tablet computer, a camera, a camcorder, a viewfinder, etc.

According to further aspects of the invention, an organic light emitting device may be provided including an anode, a cathode, and an emissive layer disposed between the anode and the cathode, in which the emissive layer includes an organic host compound and at least one organic emitting compound capable of fluorescent emission at room temperature. In embodiments, the overlap between the singlet emission spectrum of the organic emitting compound and the triplet absorption spectrum of the host compound may be less than 20 percent or preferably less than 10%.

In embodiments, at least one organic emitting compound may have a triplet energy and a singlet energy such that twice the triplet energy of the at least one organic emitting compound plus 0.3 eV is greater than the singlet energy of the at least one organic emitting compound. Preferably, twice the at least one organic emitting compound triplet energy minus 0.5 eV may be less than the at least one organic emitting compound singlet energy.

In embodiments, the emissive layer may have a thickness of, for example, about 100 nm to about 10 nm, about 75 nm to about 25 nm, or about 50 nm to about 25 nm.

In embodiments, the electroluminescent internal quantum efficiency of the emitter may be, for example, greater than 50%, or greater than 60%.

In embodiments, the emissive layer may include a dopant selected from the group consisting of: anthracene, tetracene, rubrene, and perylene and their derivatives.

In embodiments, the emissive layer may include a host selected from the group consisting of: anthracene, tetracene, rubrene, and perylene and their derivatives.

In embodiments, the device may be a consumer product.

According to further aspects of the invention, an organic light emitting device may be provided including an anode, a cathode, and an emissive layer disposed between the anode and the cathode, the emissive layer consisting essentially of one type of molecule having a triplet energy and a singlet energy. In embodiments, twice the triplet energy of the molecule plus 0.3 eV may be greater than the singlet energy of the molecule.

In embodiments, the emissive layer may have a thickness of, for example, about 100 nm to about 10 nm, about 75 nm to about 25 nm, or about 50 nm to about 25 nm.

In embodiments, the emissive molecule may be selected from the group consisting of: anthracene, tetracene, rubrene, and perylene and their derivatives.

In embodiments, the electroluminescent internal quantum efficiency of the emitter may be, for example, greater than 50%, or greater than 60%.

In embodiments, the device may be a consumer product.

Further advantages of the present subject matter will become apparent to those of ordinary skill in the art upon reading and understanding the following detailed description of the preferred embodiments.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a pixel" is a reference to one or more pixels and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

The following preferred embodiments may be described in the context of exemplary OLED devices for ease of description and understanding. However, the invention is not limited to the specifically described devices and methods, and may be adapted to various circuit assemblies without departing from the overall scope of the invention. For example, devices and related methods including concepts described herein may be used for the assembly of microchips, optoelectronic devices, such as solar cells and photodetectors, and other apparatus with multi-layer circuitry.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
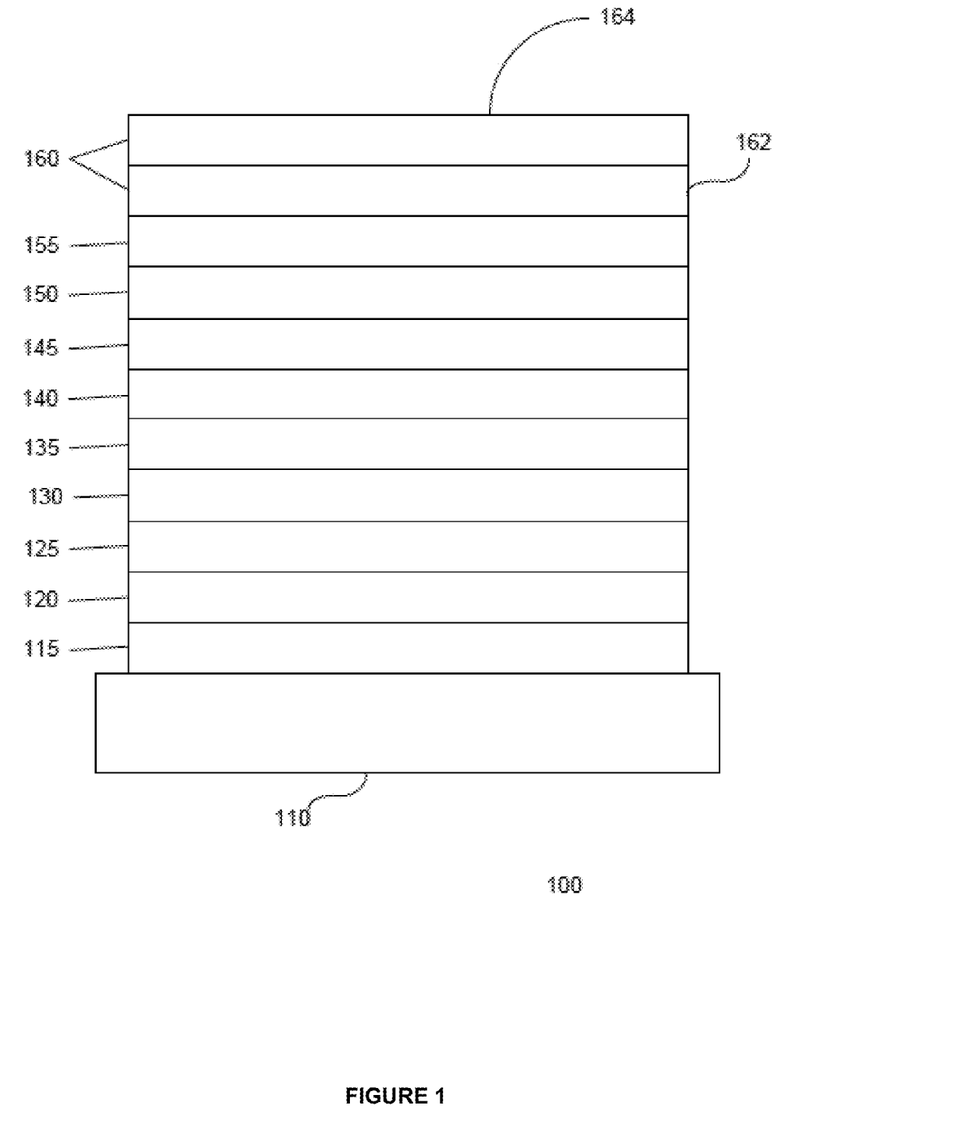
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
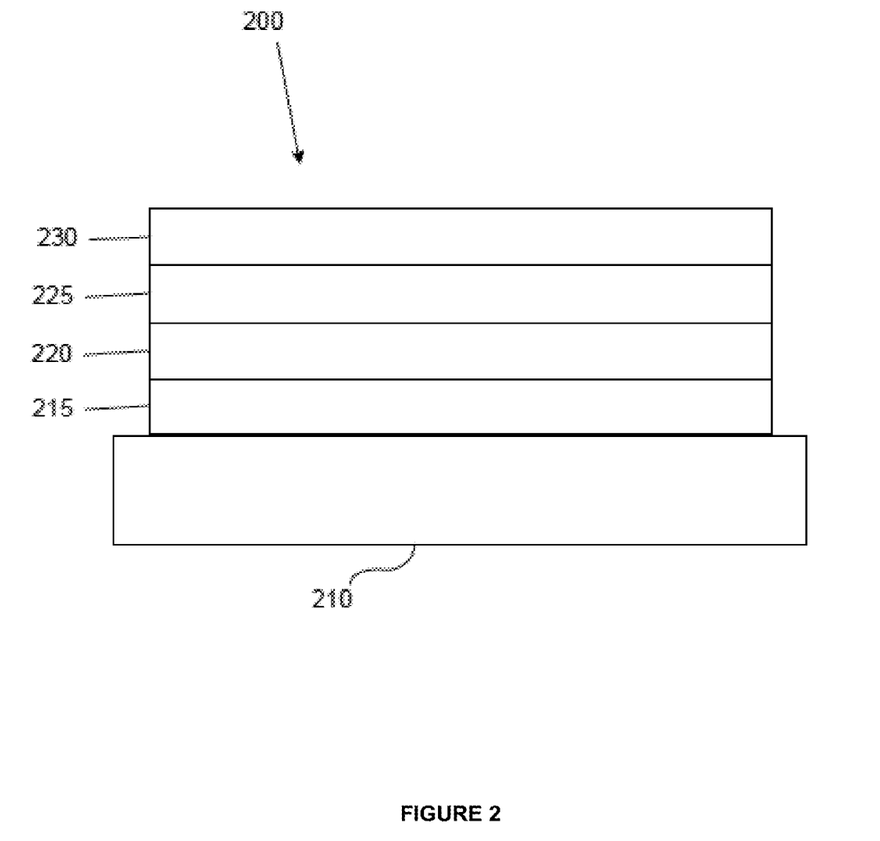
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

In fluorescent organic light emitting diodes (OLEDs), both radiative singlet excitons (singlets) and non-radiative triplet excitons (triplets) are generated as a result of electron-hole recombination. Due to spin statistics, 25% of the injected charge recombines to form singlets, and thus fluorescent OLEDs were reported to have a theoretical limit to their internal quantum efficiency (IQE) of 25%. Recently, two types of excitonic interactions, triplet-triplet (T-T) fusion, and singlet-triplet (S-T) annihilation were separately found to significantly influence the efficiency of fluorescent OLEDs. T-T fusion can generate singlets, thus increasing the theoretical limit of the IQE from 25%, to a maximum of 62.5%. On the other hand, S-T annihilation reduces the singlet density, thereby lowering the efficiency by as much as 50% at high brightness. However, the relative importance of these two effects has not, to our knowledge, been studied, and the role of triplets remains largely unexplained.

The present subject matter relates to the non-radiative triplets in fluorescent organic light emitting diodes (OLEDs) can lead to increased efficiency through triplet-triplet (T-T) fusion, or to decreased efficiency due to singlet-triplet (S-T) annihilation. The inventors have studied the tradeoff between the two processes, and determined various configurations providing a range of current densities in which T-T fusion dominates over S-T annihilation, leading to very high efficiency fluorescent OLEDs.

In this work, we study both T-T fusion and S-T annihilation in a fluorescent OLED based on its electroluminescence (EL) transients. We find that triplets can increase OLED efficiency via T-T fusion at low current densities (J), while it decreases the efficiency by quenching singlets at high J. An effective triplet current density, $J_T$, is introduced to quantify the contribution of triplets to fluorescent OLEDs' efficiencies.

Triplet fusion can follow two pathways:

$$T+T \rightarrow S+S_0 \qquad (1)$$

$$T+T \rightarrow T+S_0, \qquad (2)$$

where T is the triplet, S is the singlet, and $S_0$ is the molecular ground state. The rate constants governing the relative importance of processes (1) and (2) are $\alpha k_{TT}$ and $(1-\alpha)k_{TT}$, respectively, where $\alpha$ is the fraction of T-T fusions that follows process (1) vs. (2), $k_{TT}$ is the T-T fusion rate. The process (1) contributes to OLEDs light emission efficiency by creating additional singlets through fusion of non-radiative triplets. Several recent reports have shown $\alpha>0$, resulting in fluorescent OLEDs whose efficiencies apparently exceed the spin formation statistical limit of 25%.

In competition with T-T fusion, S-T annihilation is governed by:

$$T+S \rightarrow T+S_0. \qquad (3)$$

with the rate constant of $k_{ST}$. Thus, the singlet and triplet density dynamics are described by the pair of coupled first order equations:

$$\frac{dS}{dt} = \gamma(J)\frac{J}{4ed} - k_S S - k_{ST}ST + \alpha k_{TT}T^2 \qquad (4)$$

$$\frac{dT}{dt} = \gamma(J)\frac{3J}{4ed} - k_T T - (1+\alpha)k_{TT}T^2, \qquad (5)$$

where J is current density, $\gamma(J)$ is the charge balance factor, e is the electron charge, d is the charge recombination layer (i.e. emissive layer, or EML) thickness, and $k_S$ and $k_T$ are the singlet and triplet natural decay rates. In steady state, the external quantum efficiency, EQE(J) can then be calculated from $S(t=\infty,J)$ to give:

$$EQE(J) = \eta_{OUT}\eta_S \frac{k_S S(t=\infty, J)}{J/(ed)}, \qquad (6)$$

where $\eta_{OUT}$ is the out-coupling efficiency and $\eta_{SS}$ is the radiative efficiency of the singlet.

In rubrene, the singlet energy ($E_S$~2.2 eV) is twice the triplet energy ($E_T$~1.1 eV), thereby enabling a high, resonant T-T fusion efficiency. Hence, in our work, tetraphenyldibenzoperiflanthene (DBP) [20, 21] is doped at 1 vol % in a rubrene host as the OLED EML. The 1 mm² square OLEDs with the structure of indium-tin-oxide (ITO)/40 nm 4,4'-bis[N-(1-naphthyl)-N-phenyl-amino]-biphenyl (NPD)/35 nm EML/40 nm rubrene/5 nm bathophenanthroline (BPhen)/0.8 nm LiF/80 nm Al were fabricated following standard procedures. The EL transients following current steps of magnitudes ranging from 4 mA/cm² to 57 A/cm², and with rise and fall times of <20 ns, were measured by an avalanche photodetector and an oscilloscope with <5 ns time resolution. The current pulse widths were monotonically decreased from 100 µs at J=4 mA/cm² to 5 µs at J=57 A/cm² to ensure the OLED EL intensity reached steady state, but did not undergo thermal or electrical breakdown. The emission intensity at J=4 mA/cm² was calibrated using a Si photodetector whose area is significantly larger than that of the OLED. All measurements were performed under $N_2$ ambient.

Figure 3:
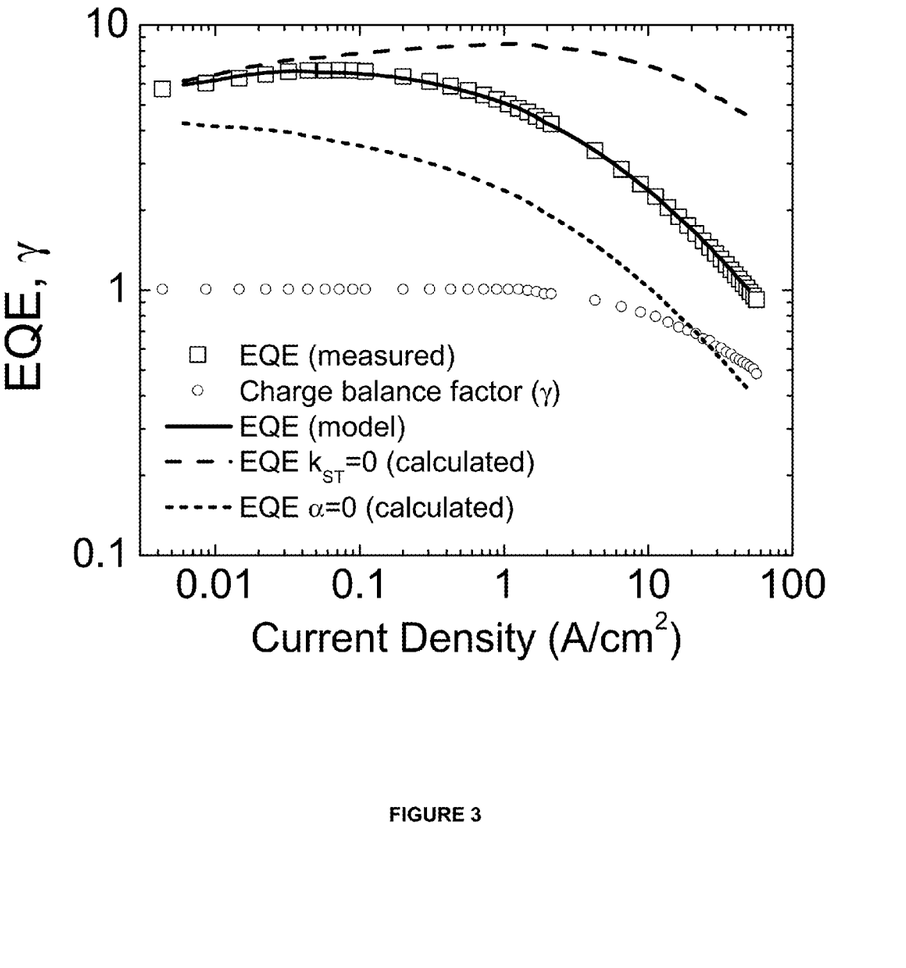
FIG. 3 is a graph showing external quantum efficiency (EQE) and charge balance factor ($\gamma(J)$) vs. current density for an organic light emitting diode using DBP doped rubrene as the emission layer (EML).

FIG. 3 shows external quantum efficiency (EQE) and charge balance factor ($\gamma(J)$) vs. current density for an organic light emitting diode using DBP doped rubrene as the emission layer (EML). The lines are calculated EQE from the model described in text; i.e. the EQE is shown in the absence of triplet-triplet (T-T) fusion (dotted line) and in the absence of singlet-triplet annihilation (dashed line).

The OLED shows a peak EQE=6.7% at J=75 mA/cm² (FIG. 3), clearly exceeding the spin statistically limited EQE=5% assuming a random orientation of molecular dipoles. The EQE undergoes a rapid roll-off with increasing J, decreasing to only 0.9% at 57 A/cm². The EL spectrum of the OLED shows pure DBP emission with no change over the entire range of J studied.

Figure 4:
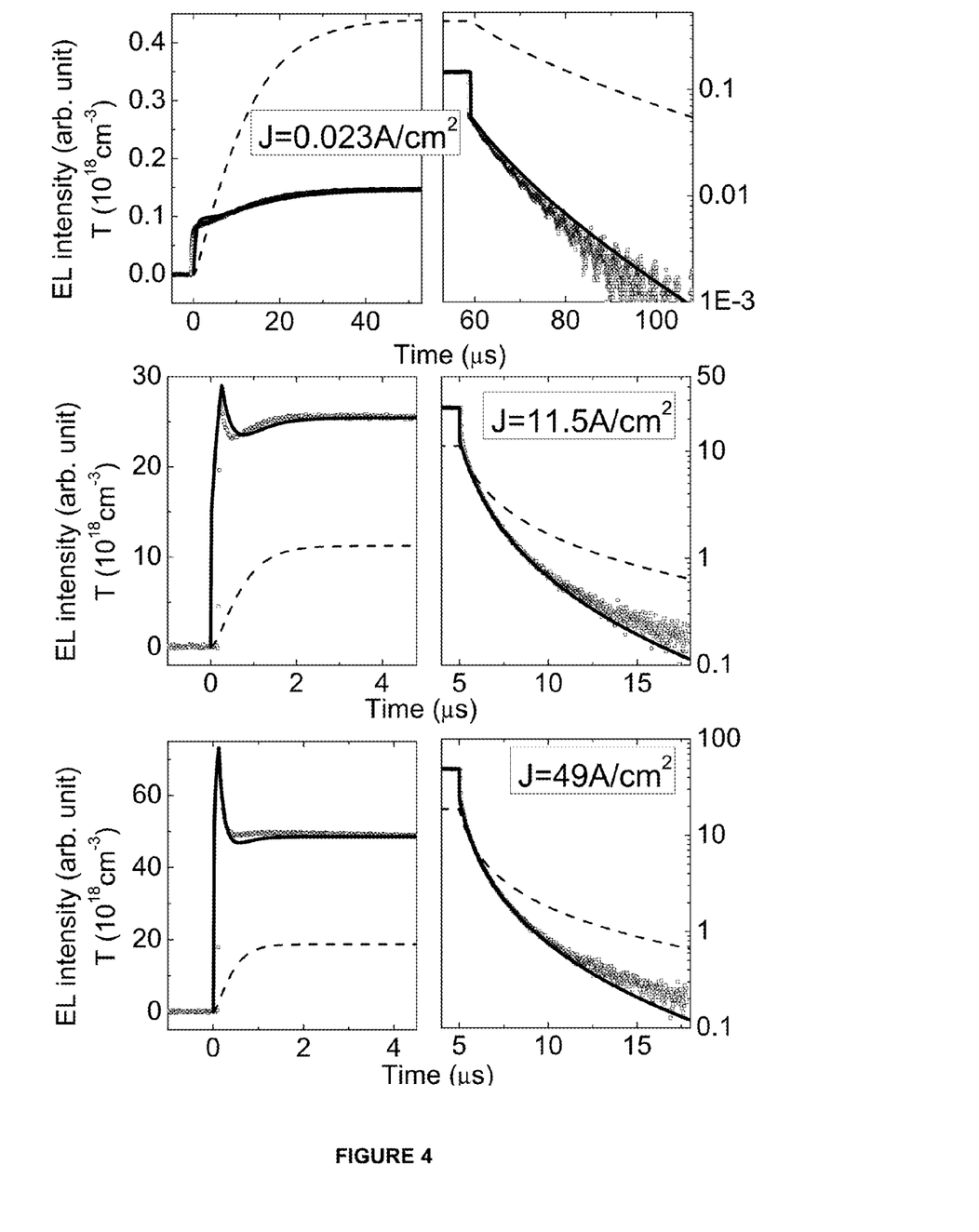
FIG. 4 show graphs of electroluminescence (EL) turn-on (left graphs) and turn-off (right graphs) transients (grey squares) for the DBP doped rubrene OLED under a current density pulse at (a) $J=0.023$ A/cm$^2$; (b) $J=11.5$ A/cm$^2$; and (c) $J=49$ A/cm$^2$.

To understand the high peak EQE followed by a rapid roll-off, we investigated the transient EL response. FIG. 4 shows electroluminescence (EL) turn-on (left graphs) and turn-off (right graphs) transients (grey squares) for the DBP doped rubrene OLED under a current density pulse at (a) J=0.023 A/cm²; (b) J=11.5 A/cm²; and (c) J=49 A/cm². The red dashed lines are model singlet densities proportional to the EL intensities, and black solid lines are the corresponding triplet densities.

The EL turn-on transients have distinctively different behaviors for low (FIG. 4A, left) vs. high (FIG. 4C, left) current densities. At low J, the EL intensity gradually increases to a steady state over tens of microseconds. This is consistent with T-T fusion since the triplet density slowly increases over this time scale. In contrast, the transient in FIG. 4C rapidly peaks and then gradually decays to a steady-state intensity approximately 70% of its peak value. This is a signature of S-T annihilation, whereby the singlet density decreases with increasing triplet density. FIG. 4B (left) shows a mixture of both T-T fusion and S-T annihilation. The EL turn-off transients for all current densities show delayed fluorescence (right graphs in FIG. 4) due to T-T fusion. The steady-state EL intensity, $EL_{tot}$, and the initial delayed fluorescence intensity, $EL_{T-T}$ (see FIG. 4A, right), are related by the ratio, $\rho(J)=EL_{T-T}/EL_{tot}$, as plotted in FIG. 5.

Figure 5:
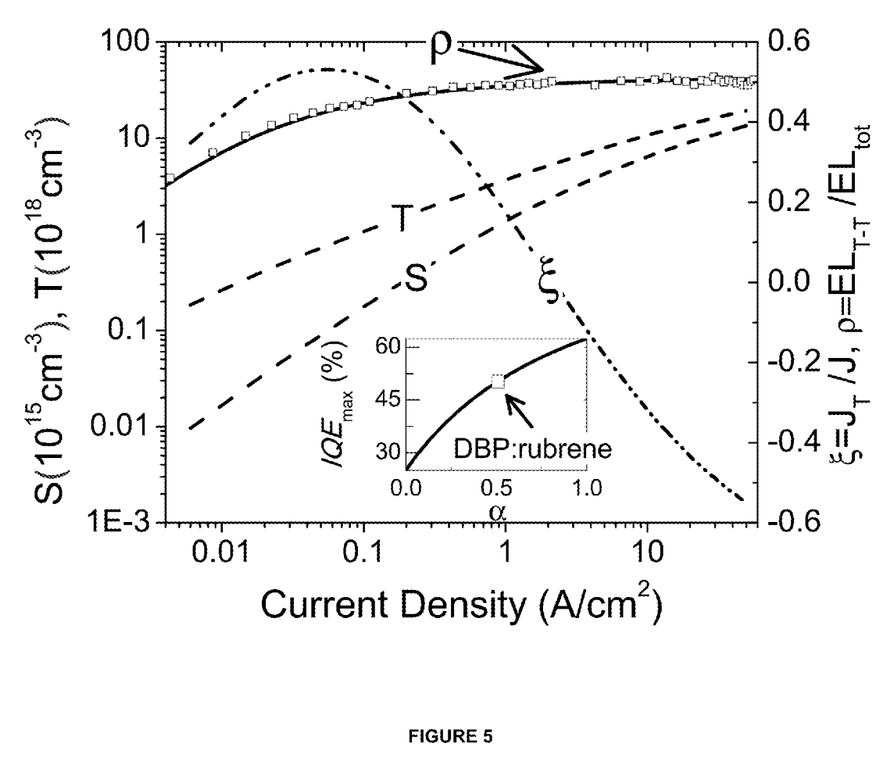
FIG. 5 shows calculated singlet (S) and triplet (T) densities (left axis), experimental (squares) and calculated (solid line) ratios of the T-T fusion to total EL ($\rho$, right axis), and the ratio $\xi$ of the effective triplet current density ($J_T$) to the current density, J.

FIG. 5 shows calculated singlet (S) and triplet (T) densities (left axis), experimental (squares) and calculated (solid line) ratios of the T-T fusion to total EL ($\rho$, right axis), and the ratio $\xi$ of the effective triplet current density ($J_T$) to the current density, J. FIG. 5 also includes an inset showing maximum internal quantum efficiency ($IQE_{max}$) for fluorescent OLEDs vs. the T-T fusion generation ratio ($\alpha$). The square shows $IQE_{max}$ for the DBP doped rubrene OLED of this work.

To quantitatively determine the relative contributions of the T-T and S-T processes, Eq's. (4) and (5) are fit to the experimental EL transients (where EL intensity is proportional to S) over the range of 4 mA/cm² < J < 57 A/cm². In these fits, the variables $\gamma(J)$, $k_{ST}$, and $k_{TT}$, are unknown, while $k_S$, $k_T$, and $\alpha$ can be independently measured. Here, $k_S=1/\tau_S=(2.6\pm0.1$ ns$)^{-1}$ is obtained from the transient photoluminescence data for a 1% DBP: rubrene film. Also, the rate $k_T=1/\tau_T=(35\pm5$ µs$)^{-1}$ is determined from the triplet lifetime, equal to twice the EL decay time constant at J=4 mA/cm² at >50 µs from the current turn-off when T-T fusion is much less efficient than the triplet natural decay. Finally, $\alpha=0.53$ is obtained from $\rho(J\to\infty)=0.51$ (see FIG. 5) using Eq's. (4) and (5):

$$\rho(J) = \frac{3\alpha k_{TT}T^2}{k_T T + (1+\alpha)k_{TT}T^2 + 3\alpha k_{TT}T^2} \quad (7)$$

where, as $J\to\infty$, $k_T T$ is negligible, leading to $$\lim_{J\to\infty} \rho = \frac{3\alpha}{4\alpha+1}.$$

According to N. C. Giebink, and S. R. Forrest, Phys. Rev. B 77 235215 (2008), $\gamma(J)$ decreases with increasing J; hence we assume $\gamma(J)=1$ at the lowest current density of J=4 mA/cm². From these measurements and assumptions, we can accurately determine $\gamma(J)$, $k_{ST}$, and $k_{TT}$ by fitting the EL transients for all J.

The modeled EL transients closely follow the data in FIG. 4. By including both T-T fusion and S-T annihilation, the model fits the entire EL transient rather than just the turn-off, as in previous reports. From the fits, we find $k_{ST}=7.1\pm10^{-11}$ cm$^{-3}$s$^{-1}$, $k_{TT}=6.0\pm10^{-14}$ cm$^{-3}$s$^{-1}$, and $\gamma(J)$ whose values are shown in FIG. 3 (open circles). According to the density functional calculation of D. Y. Kondakov et al., J. Appl. Phys. 106 124510 (2009), the triplet energy of DBP is ~0.2 eV higher than the rubrene triplet energy of 1.1 eV; thus DBP singlets are efficiently quenched by rubrene triplets. Also, since T-T fusion is a short-range Dexter interaction, the high $k_{TT}$ in rubrene suggests a high triplet diffusivity. Finally, we find $\gamma(J)\approx1$ except at J>1 A/cm², after which it decreases due to charge leakage through the EML, and field-induced exciton dissociation. We note that exciton-polaron annihilation is also possible. Inclusion of these processes is not needed in the fits to the data, and hence they are not anticipated to play a significant role.

With these experimentally determined rates, steady-state values for S and T are calculated and shown in FIG. 5. The model EQE(J) in FIG. 3 is then derived from S according to Eq. (6) using $\eta_{OUT}\eta_S=17.3\%$ obtained from the magnitude of EQE(J). The peak EQE>5% is a result of T-T fusion, the scale of which can be characterized by $\rho$, also shown in FIG. 5. At J<0.1 A/cm², $k_{TT}T$ is comparable to $k_T$, which increases with J, resulting in the monotonic increase of $\rho(J)$. At J>1 A/cm², $k_{TT}\gg k_T$ and thus $\rho$ saturates according to Eq. (7). In general, the upper limit $$IQE_{max} = \frac{25\%}{(1-\rho)}$$
$$= 25\% \times \frac{4\alpha+1}{\alpha+1},$$

as plotted in the inset of FIG. 5. For the OLED in this work, $\alpha=0.53$, corresponding to $IQE_{max}=51\%$. When $\alpha=1$, $IQE_{max}=62.5\%$, consistent with the result of D. Y. Kondakov et al., J. Appl. Phys. 106 124510 (2009). This upper limit can only be reached for $k_{TT}T\gg k_T$ in the presence of negligible S-T annihilation.

To put both T-T and S-T interactions into the same context, we define the effective triplet current density as:

$$J_T = \frac{4ed}{\gamma(J)}(\alpha k_{TT}T^2 - k_{ST}ST). \quad (8)$$

Using this definition, Eq. (1) can be simplified to $$\frac{dS}{dt} = \gamma(J)\frac{J}{4ed}[1+\xi]k_S S,$$

where the ratio, $\xi=J_T/J$ in FIG. 5, characterizes which process (T-T fusion or S-T annihilation) dominates. Indeed, for $\gamma(J)=1$ then IQE=25×(1+$\xi$)%. With increasing J, $\xi$ is initially positive and increases due to T-T fusion to a peak of $\xi=0.53$ at J=50 mA/cm², and then decreases due to the onset of S-T annihilation. Above the critical current density of $J_C=2.2$ A/cm², $\xi$ becomes negative, where triplets lead to a decrease in quantum efficiency.

Figure 6:
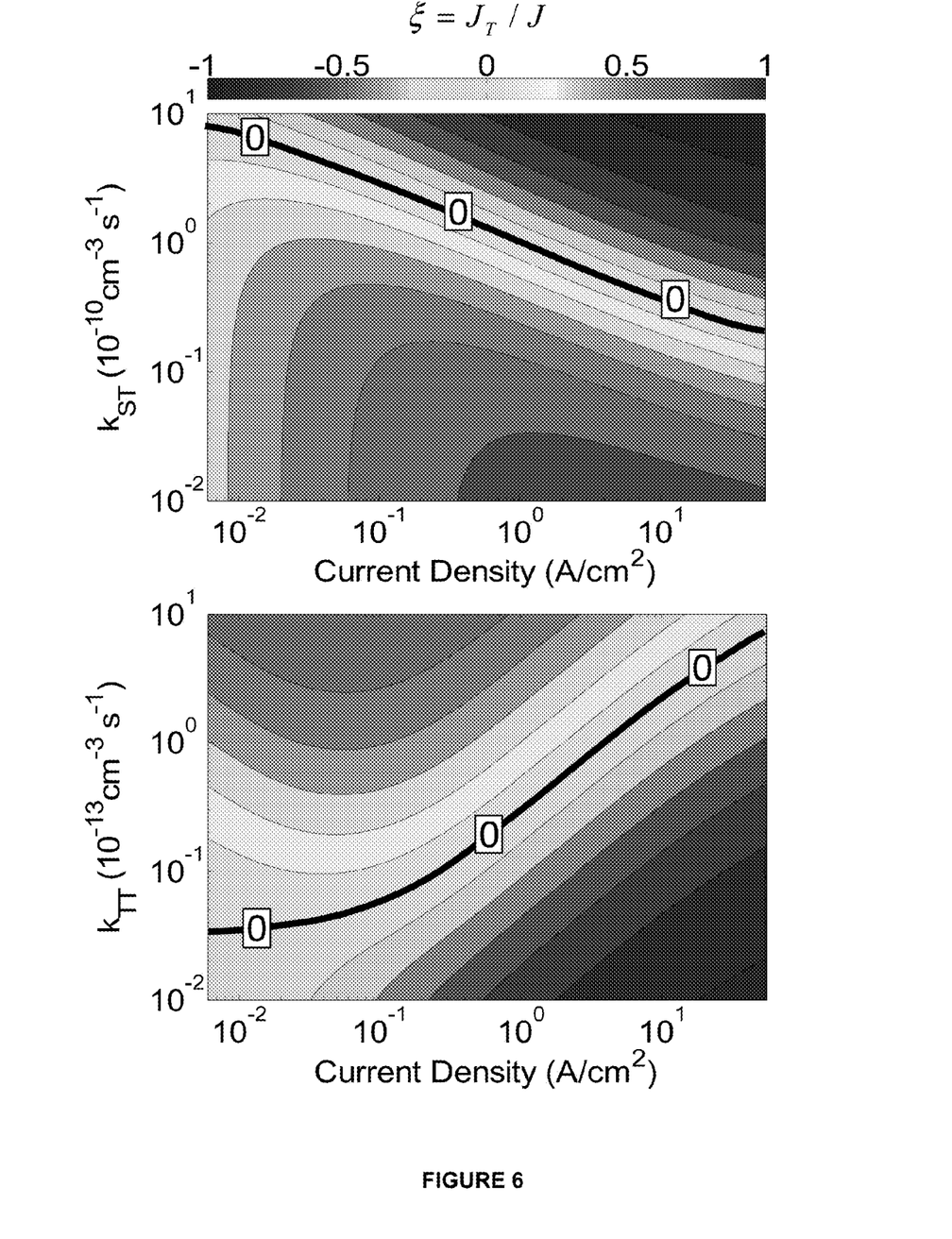
FIG. 6 shows ratio $\xi$ vs. J, as a function of the (a) S-T annihilation rate $k_{ST}$ and (b) T-T fusion rate $k_{TT}$, keeping other parameters as found for the DBP doped rubrene OLED.

The dependence of $\xi$ on J changes with $k_{ST}$ and $k_{TT}$. FIG. 6 shows ratio $\xi$ vs. J, as a function of the (a) S-T annihilation rate $k_{ST}$ and (b) T-T fusion rate $k_{TT}$, keeping other parameters as found for the DBP doped rubrene OLED. Here, "0" indicates the contour where triplets show no net contribution to OLED efficiency. Also, $\xi$ changes by 0.15 between adjacent contours.

In FIG. 6, $\xi$ vs. J is calculated for different $k_{ST}$ while keeping other parameters constant. As $k_{ST}$ increases, $J_C$ decreases, as does $\xi$. In contrast, with increasing $k_{TT}$, both $\xi$ and $J_C$ increase. Thus, besides requiring that $E_S \leq 2E_T$ to achieve a large $\alpha$, fluorescent OLEDs with high EQE at high brightness also require a large $k_{TT}$ and small $k_{ST}$. Now $k_{TT}$ is proportional to the triplet diffusivity which increases with crystalline order, and $k_{ST}$ is proportional to the overlap between the singlet emission and triplet absorption spectra, providing guidance in choosing materials that can lead to a high efficiency.

Based on $J_T$, two limiting cases of EQE in FIG. 3 are calculated; one for $\alpha=0$ (where T-T fusion does not generate singlets according to Eq. (2)), and the other for $k_{ST}=0$ (no S-T annihilation). The differences between these calculated EQE's and the data show the relative effects of T-T fusion and S-T annihilation that are responsible for the high peak EQE and rapid roll-off with J, respectively.

Figure 7:
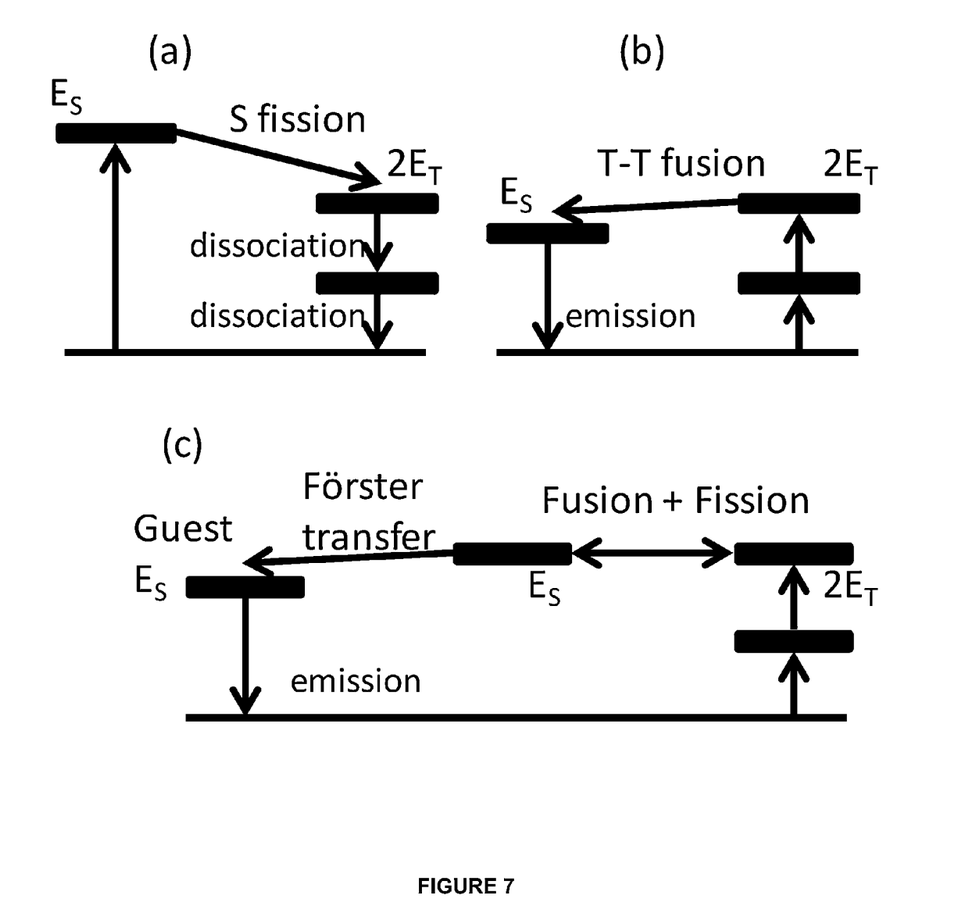
FIG. 7 shows preferred energetics according to aspects of the invention.

FIGS. 7A-7C show preferred energetics according to aspects of the invention. FIG. 7A depicts preferred energetics for singlet fission where singlet energy, $E_S$, is slightly larger than twice the triplet energy, $2E_T$. This process can potentially lead to doubled efficiency in excitonic solar cells because each absorbed photon can results in two triplets' dissociations. The arrows indicate energy transfers in solar cells utilizing singlet fission. FIG. 7B depicts preferred energetics for T-T fusion where $E_S$ is slightly smaller than $2E_T$. The arrows indicate energy transfers in OLEDs utilizing T-T fusion. FIG. 7C depicts a case for rubrene, where $E_S=2E_T$, and singlet fission and T-T fusion compete. The use of a guest emitter molecule (e.g. DBP) is essential for realizing high efficiency from rubrene based OLEDs. These examples are described further below.

Singlet fission is a process in which one singlet shares its energy with a neighboring ground state, and both are converted into triplets. It requires that $E_S \geq 2E_T$ as shown in FIG. 7A. For each absorbed photon, two electron-hole pairs can be harvested, and thus fission has the potential of doubling the efficiency of excitonic solar cells. In contrast, T-T fusion through Eq. 1 is the reverse process of singlet fission, where we require that $E_S \leq 2E_T$ (see FIG. 7B). If a molecule with efficient T-T fusion is also an efficient fluorphore, an undoped EML can be used.

For rubrene, the singlet and triplet energies are in resonance, i.e. $E_S=2E_T$ (see FIG. 7C). In this case, both efficient T-T fusion and singlet fission can co-exist and compete. Therefore, the use of undoped rubrene cannot result in an efficient OLED since singlet fission typically occurs in times less than a picoseconds, and therefore dominates over rubrene singlet emission. Indeed, when a rubrene-only EML was used, we observed a peak EQE<0.2%. On the other hand, the use of DBP as a dopant in rubrene results in a peak EQE of 6.7%. According to our analysis, the singlet natural decay rate ($k_S$) and S-T annihilation rate ($k_{ST}T$) both occur within nanoseconds, while T-T fusion ($k_{TT}T$) has microsecond duration, all of which are much slower than singlet fission. The high EQE, therefore, results from the surprisingly fast Förster transfer from rubrene to DBP, which dominates over the rubrene singlet fission. From another prospective, fast Förster transfer of singlets represents a significant loss mechanism for singlet fission in excitonic solar cells, and should be avoided in those devices.

According to the above analysis, three physical parameters are shown to be important for approaching the max IQE (e.g. of 62.5%) in high brightness fluorescent organic light emitting diodes (OLEDs) utilizing triplet-triplet fusions. They are $\alpha$, the fraction for singlet formation in the T-T fusion process; $k_{TT}$, the overall T-T fusion rate; and $k_{ST}$, the singlet-triplet annihilation rate. The IQE is optimized for maximized $\alpha$ (ideally 100%), maximized $k_{TT}$ (ideally $>10^{-13}$ cm$^{-3}$s$^{-1}$), and minimized $k_{ST}$ (ideally $<10^{-11}$ cm$^{-3}$s$^{-1}$). Under this condition, singlet generation rate through T-T fusion can be maximized and singlet loss rate through S-T quenching can be minimized. In the following, we describe the OLEDs' emissive layer (EML) material choice for approaching the ideal $\alpha$, $k_{TT}$, and $k_{ST}$. In the following, we describe three type of EML energetics.

Type I: The emissive layer is a guest-host binary mix and the host triplet energy ($E_{HT}$) is lower than the guest triplet energy ($E_{GT}$). It is required that $2E_{HT}$ is equal to or slightly larger than (within 0.5 eV) the singlet energy of the host, $E_{HS}$. This will result in large a. However, it is equally important that the host-host T-T fusion rate, $k_{TT}$ is large. This can be achieved by enhancing the crystalline order and thus the triplet diffusivity of the EML. Possible routes include use of molecules that easily form crystals, post deposition anneal, and use of templating layers before the EML deposition. A high $\alpha$ and $k_{TT}$ can result in high peak efficiency; also, a low $k_{ST}$ is essential for maintaining the high efficiency with increasing the current density (or brightness). The later can be realized by properly choose the guest (emitter) so its emission spectrum is shifted away from the host triplet absorption spectrum.

Type II: The emissive layer is a guest-host binary mix and the host triplet energy ($E_{HT}$) is higher than the guest triplet energy ($E_{GT}$). For realizing a large a, it is required that $2E_{GT}$ is equal to or slightly larger than (within 0.5 eV) the singlet energy of the guest, $E_{GS}$. Also, $k_{TT}$ now refers to guest-guest T-T fusion, and needs to be maximized. Lastly, $k_{ST}$ needs to be low for maintaining the high efficiency with increasing the current density (or brightness). This is achieved if the guest emission spectrum is shifted away from its own triplet absorption spectrum.

Type III: The emissive layer only consists of one type of molecule with triplet energy of $E_T$ for both exciton formation and emission. For realizing a large $\alpha$, it is required that $2E_T$ is equal to or slightly larger than (within 0.5 eV) the singlet energy of the molecule, $E_S$. Also, a large $k_{TT}$ is preferable, which can be realized through enhanced crystalline order and thus triplet diffusivity. Possible routes include use of molecules that easily form crystals, post deposition anneal, and use of templating layers before the EML deposition. Lastly, this molecule should have its emission spectrum shifted away from its triplet absorption spectrum for a low $k_{ST}$ in order for maintaining the high efficiency at high current density (or brightness).

CONCLUSIONS

In conclusion, we have developed models that accurately describe singlet and triplet density dynamics in fluorescent OLEDs over five decades of current density. Based on this model, the dependence of the internal quantum efficiency limits of fluorescent OLEDs on T-T fusion is obtained, explaining the high peak efficiency of 6.7% experimentally observed. The overall effect of triplets, including T-T fusion and S-T annihilation, is understood by introducing the concept of an effective triplet current density that is used to describe the efficiency roll-off at high current densities and brightness. Our model provides guidance for the appropriate design of molecules and device structures that can be used for high efficiency fluorescent OLEDs as well as organic photovoltaics employing singlet fission.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

A preferred use of devices fabricated in accordance with embodiments of the invention is use for general illumination purposes, such as white light having a high CRI (color rendering index) and CIE coordinates corresponding to light that appears white to a viewer. Phosphorescent OLED technology is generally more efficient than fluorescent OLED technology, and as such phosphorescent OLED technology is preferred over fluorescent OLED technology for general illumination purposes, where reducing power consumption is highly desirable. OLED devices as described herein may be used in other types of devices, such as displays and other consumer products, and may be particularly preferred for use as the blue component of such devices.

A first device is provided. The first device further comprises an organic light emitting device. The organic light emitting device further comprises an anode, a cathode, and an emissive layer disposed between the anode and the cathode. The emissive layer further comprises an organic host compound and an organic emitting compound capable of fluorescent emission at room temperature. The overlap between the singlet emission spectrum of the organic emitting compound and the triplet absorption spectrum of the host compound may be less than 20 percent or preferably less than 10%.

The host compound may have a triplet energy and a singlet energy, preferably such that twice the host compound triplet energy plus 0.3 eV may greater than the host compound singlet energy. Preferably, twice the host compound triplet energy minus 0.5 eV is less than the host compound singlet energy. One advantage of providing compounds in which twice the compound triplet energy minus 0.5 eV is less than the compound singlet energy reason is that it allows the heat dumped during T-T fusion to be small (<0.5 eV) and thus the process to be efficient.

Preferably, the exciton diffusion length may be at least greater than half the thickness of the emissive layer.

The first device may include various other layers such as those described with reference to FIGS. 1 and 2. The first device preferably further includes a hole transport layer disposed between the emissive layer and the anode, and an electron transport layer disposed between the emissive layer and the cathode. The organic emitting compound may be present only in the emissive layer.

Preferably, the emissive layer may have a thickness of, for example, about 100 nm to about 10 nm, about 75 nm to about 25 nm, or about 50 nm to about 25 nm.

Preferably, the electroluminescent internal quantum efficiency of the emitter may be, for example, greater than 50%, or greater than 60%.

Preferably, the emissive layer may include tetraphenyldibenzoperiflanthene doped in rubrene. In embodiments, the tetraphenyldibenzoperiflanthene may be doped at about 1 vol %.

Preferably, the emissive layer may include a dopant selected from the group consisting of: anthracene, tetracene, rubrene, and perylene and their derivatives.

Preferably, the emissive layer may include a host selected from the group consisting of: anthracene, tetracene, rubrene, and perylene and their derivatives.

The first device may also include an outcoupling enhancement structure adapted to increase the amount of light outcoupled from the first device by at least 25%, and more preferably by at least 50%, relative to a device having no outcoupling enhancement structure. Outcoupling enhancement structures are well known, and may include:

nanopatterning of a glass substrate—50% increase in amount of light outcoupled reported in Gu, et. al, Opt. Lett., 22, 396 (1997)

microlens array—80% increase in amount of light outcoupled reported in Moller et. al, J. Appl. Phys., 91, 3324 (2001)

silica aerogels—80% increase in amount of light outcoupled reported in T. Tsutsui et. al, Advanced Materials, 13, 1149 (2001)

shaped substrates—90% increase in amount of light outcoupled reported in Madigan et. al, Appl. Phys. Lett., 76, 1650, (2000)

low index grid—31% increase in amount of light outcoupled reported in Slootsky et. al, Appl. Phys. Lett., 94, 163302 (2009)

One or more outcoupling enhancement structures may be combined to result in a total enhancement as described.

In some embodiments, the first device is a consumer product.

A second device is also provided. The second device further comprises an organic light emitting device. The organic light emitting device further comprises an anode, a cathode, and an emissive layer disposed between the anode and the cathode. The emissive layer further comprises an organic host compound and an organic emitting compound capable of fluorescent emission at room temperature. The overlap between the singlet emission spectrum of the organic emitting compound and the triplet absorption spectrum of the host compound may be less than 20 percent or preferably less than 10%.

Preferably, at least one organic emitting compound may have a triplet energy and a singlet energy such that twice the triplet energy of the at least one organic emitting compound plus 0.3 eV is greater than the singlet energy of the at least one organic emitting compound. Preferably, twice the at least one organic emitting compound triplet energy minus 0.5 eV is less than the at least one organic emitting compound singlet energy.

The second device may include various other layers such as those described with reference to FIGS. 1 and 2. The second device preferably further includes a hole transport layer disposed between the emissive layer and the anode, and an electron transport layer disposed between the emissive layer and the cathode. The organic emitting compound may be present only in the emissive layer.

Preferably, the emissive layer may have a thickness of, for example, about 100 nm to about 10 nm, about 75 nm to about 25 nm, or about 50 nm to about 25 nm.

Preferably, the electroluminescent internal quantum efficiency of the emitter may be, for example, greater than 50%, or greater than 60%.

Preferably, the emissive layer may include a dopant selected from the group consisting of: anthracene, tetracene, rubrene, and perylene and their derivatives.

Preferably, the emissive layer may include a host selected from the group consisting of: anthracene, tetracene, rubrene, and perylene and their derivatives.

The second device may also include an outcoupling enhancement structure adapted to increase the amount of light outcoupled from the first device by at least 25%, and more preferably by at least 50%, relative to a device having no outcoupling enhancement structure. Outcoupling enhancement structures are well known, and may include:

nanopatterning of a glass substrate ~50% increase in amount of light outcoupled reported in Gu, et. al, Opt. Lett., 22, 396 (1997)

microlens array—80% increase in amount of light outcoupled reported in Moller et. al, J. Appl. Phys., 91, 3324 (2001)

silica aerogels—80% increase in amount of light outcoupled reported in T. Tsutsui et. al, Advanced Materials, 13, 1149 (2001)

shaped substrates—90% increase in amount of light outcoupled reported in Madigan et. al, Appl. Phys. Lett., 76, 1650, (2000)

low index grid—31% increase in amount of light outcoupled reported in Slootsky et. al, Appl. Phys. Lett., 94, 163302 (2009)

One or more outcoupling enhancement structures may be combined to result in a total enhancement as described.

In some embodiments, the second device is a consumer product.

A third device is also provided. The third device further comprises an organic light emitting device. The organic light emitting device further comprises an anode, a cathode, and an emissive layer disposed between the anode and the cathode. The emissive layer preferably consists essentially of one type of molecule having a triplet energy and a singlet energy such that twice the triplet energy of the molecule plus 0.3 eV is greater than the singlet energy of the molecule.

The third device may include various other layers such as those described with reference to FIGS. 1 and 2. The third device preferably further includes a hole transport layer disposed between the emissive layer and the anode, and an electron transport layer disposed between the emissive layer and the cathode. The organic emitting compound may be present only in the emissive layer.

Preferably, the emissive layer may have a thickness of, for example, about 100 nm to about 10 nm, about 75 nm to about 25 nm, or about 50 nm to about 25 nm.

Preferably, the emissive molecule may be selected from the group consisting of: anthracene, tetracene, rubrene, and perylene and their derivatives.

Preferably, the electroluminescent internal quantum efficiency of the emitter may be, for example, greater than 50%, or greater than 60%.

The third device may also include an outcoupling enhancement structure adapted to increase the amount of light outcoupled from the first device by at least 25%, and more preferably by at least 50%, relative to a device having no outcoupling enhancement structure. Outcoupling enhancement structures are well known, and may include:

nanopatterning of a glass substrate—50% increase in amount of light outcoupled reported in Gu, et. al, Opt. Lett., 22, 396 (1997)

microlens array—80% increase in amount of light outcoupled reported in Moller et. al, J. Appl. Phys., 91, 3324 (2001)

silica aerogels—80% increase in amount of light outcoupled reported in T. Tsutsui et. al, Advanced Materials, 13, 1149 (2001)

shaped substrates—90% increase in amount of light outcoupled reported in Madigan et. al, Appl. Phys. Lett., 76, 1650, (2000)

low index grid—31% increase in amount of light outcoupled reported in Slootsky et. al, Appl. Phys. Lett., 94, 163302 (2009)

One or more outcoupling enhancement structures may be combined to result in a total enhancement as described.

In some embodiments, the third device is a consumer product.

A method is also provided. The method may be practiced by manufacturing any of the above described devices, such as the first, second or third device, with the specific features described therein.

For example, an organic light emitting device may be manufactured using known techniques, but depositing, or otherwise forming, the layers described above with materials that meet the enumerated criteria.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works, and modeling of specific configurations, are not intended to be limiting.

The invention claimed is:

1. An organic light emitting device, comprising:
an anode;
a cathode; and
an emissive layer disposed between the anode and the cathode, the emissive layer including an organic host compound and at least one fluorescent organic emitting compound capable of fluorescent emission at room temperature and generates both radiative singlet excitons and non-radiative triplet excitons as a result of electron-hole recombination;
wherein:
the overlap between the singlet emission spectrum of the fluorescent organic emitting compound and the triplet absorption spectrum of the host compound is less than 20 percent;
wherein the host compound has a triplet energy and a singlet energy; and
wherein twice the host compound triplet energy plus 0.3 eV is greater than the host compound singlet energy and twice the host compound triplet energy minus 0.5 eV is less than the host compound singlet energy.

2. The device of claim 1, wherein the exciton diffusion length is at least greater than half the thickness of the emissive layer.

3. The device of claim 1, wherein the emissive layer has a thickness of about of about 100 nm to about 10 nm.

4. The device of claim 3, wherein the emissive layer has a thickness of about 75 nm to about 25 nm.

5. The device of claim 4, wherein the emissive layer has a thickness of about 50 nm to about 25 nm.

6. The device of claim 1, wherein the electroluminescent internal quantum efficiency of the emitter is greater than 50%.

7. The device of claim 1, wherein the electroluminescent internal quantum efficiency of the emitter is greater than 60%.

8. The device of claim 1, wherein the emissive layer includes tetraphenyldibenzoperiflanthene doped in rubrene.

9. The device of claim 8, wherein the tetraphenyldibenzoperiflanthene is doped at 1 vol %.

10. The device of claim 1, wherein the emissive layer includes a dopant selected from the group consisting of: anthracene, tetracene, rubrene, and perylene and their derivatives.

11. The device of claim 1, wherein the emissive layer includes a host selected from the group consisting of: anthracene, tetracene, rubrene, and perylene and their derivatives.

12. The device of claim 1, wherein the device is a consumer product.

13. An organic light emitting device, comprising:
an anode;
a cathode; and
an emissive layer disposed between the anode and the cathode, the emissive layer including an organic host compound and at least one fluorescent organic emitting compound capable of fluorescent emission at room temperature and generates both radiative singlet excitons and non-radiative triplet excitons as a result of electron-hole recombination;
wherein:
the overlap between the singlet emission spectrum of the fluorescent organic emitting compound and the triplet absorption spectrum of the host compound is less than 20 percent;
wherein the at least one fluorescent organic compound has a triplet energy and a singlet energy; and
wherein twice the triplet energy of the at least one fluorescent organic emitting compound plus 0.3 eV is greater than the singlet energy of the at least one fluorescent organic emitting compound and twice the at least one fluorescent organic emitting compound triplet energy minus 0.5 eV is less than the at least one fluorescent organic emitting compound singlet energy.

14. The device of claim 13, wherein the emissive layer has a thickness of about of about 100 nm to about 10 nm.

15. The device of claim 14, wherein the emissive layer has a thickness of about 75 nm to about 25 nm.

16. The device of claim 14, wherein the emissive layer has a thickness of about 50 nm to about 25 nm.

17. The device of claim 13, wherein the electroluminescent internal quantum efficiency of the emitter is greater than 50%.

18. The device of claim 13, wherein the electroluminescent internal quantum efficiency of the emitter is greater than 60%.

19. The device of claim 13, wherein the emissive layer includes a dopant selected from the group consisting of: anthracene, tetracene, rubrene, and perylene and their derivatives.

20. The device of claim 13, wherein the emissive layer includes a host selected from the group consisting of: anthracene, tetracene, rubrene, and perylene and their derivatives.

21. The device of claim 13, wherein the device is a consumer product.

22. An organic light emitting device, comprising:
an anode;
a cathode; and
an emissive layer disposed between the anode and the cathode, the emissive layer consisting essentially of one type of fluorescent molecule having a triplet energy and a singlet energy, and generates both radiative singlet excitons and non-radiative triplet excitons as a result of electron-hole recombination;
wherein:
twice the triplet energy of the fluorescent molecule plus 0.3 eV is greater than the singlet energy of the molecule.

23. The device of claim 22, wherein the emissive layer has a thickness of about of about 100 nm to about 10 nm.

24. The device of claim 23, wherein the emissive layer has a thickness of about 75 nm to about 25 nm.

25. The device of claim 23, wherein the emissive layer has a thickness of about 50 nm to about 25 nm.

26. The device of claim 22, wherein the emissive molecule is selected from the group consisting of: anthracene, tetracene, rubrene, and perylene and their derivatives.

27. The device of claim 22, wherein the electroluminescent internal quantum efficiency of the emitter is greater than 50%.

28. The device of claim 22, wherein the electroluminescent internal quantum efficiency of the emitter is greater than 60%.

29. The device of claim 22, wherein the device is a consumer product.

* * * * *